May 13, 1969 D. B. THOMAS 3,444,495

SUPERCONDUCTORS

Filed Oct. 16, 1967

United States Patent Office 3,444,495
Patented May 13, 1969

3,444,495

SUPERCONDUCTORS

David Brynmor Thomas, Abingdon, England, assignor to Science Research Council, London, England Filed Oct. 16, 1967, Ser. No. 675,620
Claims priority, application Great Britain, Oct. 18, 1966, 46,634/66
Int. Cl. H01f *27/28*
U.S. Cl. 336—223 5 Claims

ABSTRACT OF THE DISCLOSURE

A composite electrical conductor comprises a length of superconductor and a normal conductor of high electrical conductivity which parallels the superconductor and to which the superconductor makes good electrical contact at predetermined intervals along the length of the superconductor. A coil embodying this principle may consist of a hollow copper cylinder with a superconductor wound therein and contacting it at circumferential intervals.

*Background of the invention*

This invention relates to superconductors and to electrical arrangements including superconductors.

When superconducting coils were built it was found that their performance was seriously degraded by unpredictable premature transition of the superconductor to the normal (non-superconducting) state. In order to overcome this problem various forms of composite electrical conductor have been used. These composite conductors comprise a superconductor in intimate contact throughout its length with a normal conductor of high conductivity, the normal conductor acting as a shunt when a transient instability causes a portion of the superconductor to become normal. When the transient has ended the normal portion of the superconductor becomes superconducting again and the current returns to it. The normal conductor usually used is copper or aluminum.

Where a big coil is to generate a magnetic field of high strength, say about 50 kilogauss or more, this arrangement is not satisfactory. Difficulties arise because the forces associated with the magnetic field are so large that deformation of the copper occurs. This in itself is serious, but even more serious is the fact that the superconductor, which in comparison with the copper is usually either extremely brittle or extremely strong, is very likely to be damaged or broken when the copper deforms.

It is therefore an object of the present invention to provide a new or imroved form of composite electrical conductor.

*Summary of the invention*

According to the present invention, a composite electrical conductor comprises a length of superconductor and a normal conductor of high electrical conductivity which parallels the superconductor and to which the superconductor makes good electrical contact at predetermined intervals along the length of the superconductor. The intervals are determined such that the bending stress in the superconductor is less than the hoop stress would be when the conductor is formed into a coil as is hereinafter explained.

Preferably the normal conductor is copper.

A coil in accordance with the invention comprises a rigid outer ring of normal high conductivity material and an inner ring of superconducting material. The rings being mechanically and electrically connected at circumferential intervals and spaced apart therebetween, each interval being less than that at which the bending stress in the superconducting material equals the hoop stress in the rigid conductor under the action of a magnetic field due to current in the coil.

A coil in accordance with the present invention may also comprise a hollow cylinder of copper on the inner surface of which the superconductor is wound, either helically or in separate closed turns, the superconductor making good electrical contact to the copper at predetermined intervals along its length, for example by being brazed, soldered or welded to the copper at intervals, and being out of contact with the copper along the remainder of its length.

*Description of the drawings*

Two embodiments of the present invention will now be described with reference to the accompanying diagrammatic drawing, in which:

Referring to FIGURE 1, this shows a composite electrical conductor comprising a copper strip 1 and a superconducting wire 2. The strip 1 is formed with projections 3 regularly spaced along its length and to these projections 3 the wire 2 is secured in good electrical contact by being brazed, welded or soldered. This is done so that the wire 2 is slack between the projections 3 when the composite conductor is formed into its operative configuration, for example, by being wound into a coil.

During use of the composite conductor, transient normality in a portion of the wire 2 will cause the current to transfer temporarily to the strip 1. Furthermore, it is possible for the strip 1 to deform appreciably under the forces due to the magnetic field associated with the current flowing in the superconductor without any stress being applied to the wire 3. There is therefore much less chance of the superconductor being damaged or broken than with the prior composite conductors.

Although the copper and superconductor have been described as being in the form of strip and wire respectively, it will be clear that these forms can be varied considerably whilst still retaining the advantage referred to above. For example, the copper may be in the form of a flat strip, and the superconductor in the form of a wire bent to an approximately sinusoidal shape and resting against one side of the strip with the plane of the wire normal to the plane of the strip. The wire is secured to the strip in the regions where it touches.

Figure 1:
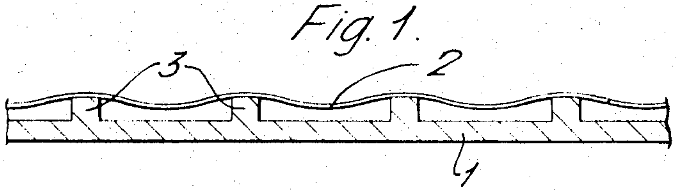
FIGURE 1 shows a cross-section through a composite electrical conductor.
Figure 2:
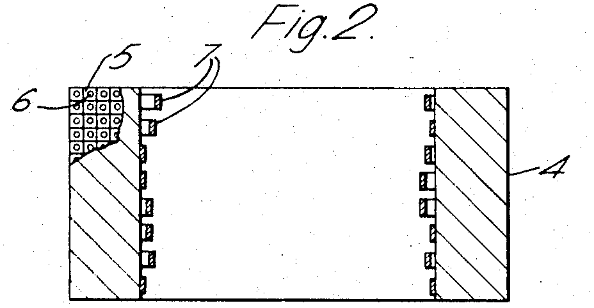
FIGURE 2 shows a cross-section through a coil.
Figure 3:
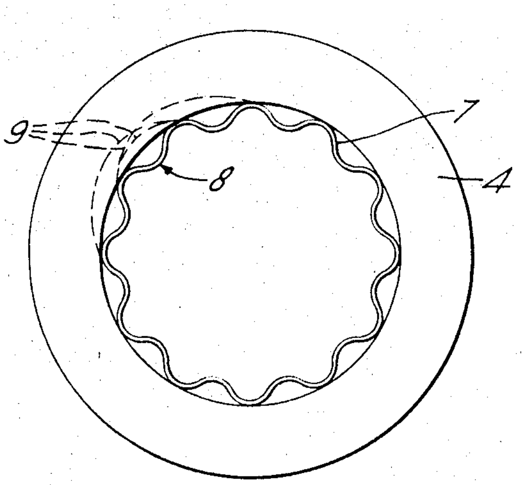
FIGURE 3 shows a plan view of the coil of FIGURE 2.

Referring to FIGURES 2 and 3, this shows a coil comprising a hollow right circular cylinder 4 of copper. This may be formed by winding a bar 5 of copper of rectangular cross section having a bore 6 through which liquid helium is pumped to get the necessary cooling of the superconductor. To give greater strength to the cylinder 4 a stainless steel tension wire (not shown) may be passed through the bore 6.

The superconductor is in the form of a strip 7 of rectangular cross section which is wound, either helically or in separate closed turns, around the inner surface of the cylinder 4. The strip 7 is shaped to an approximately sinusoidal form visible in FIGURE 3, and is secured in good electrical contact with the cylinder 4 by being brazed, soldered or welded to the copper where it touches. The contact areas may amount in all to 10% of the surface area of the strip 7.

During use of the coil, transient normality in a portion of the strip 7 will cause the current to transfer temporarily to the cylinder 4. It is to be noted that if the normality occurs at the point 8 say the current has many alternative paths which it may take through the copper, some of these paths being indicated by the broken lines 9 in FIGURE 3. Furthermore, it is possible for the cylinder 4 to deform appreciably under the forces due to the magnetic field associated with the current flowing in the superconductor without any hoop stress being applied to the strip 7. Again, therefore, the possibility of the superconductor being damaged or broken is much reduced.

Although no hoop stress is applied to the strip 7 a bending stress will have been introduced which is a function of the spacing between contact areas. It can be shown, in fact, that the bending stress in the corrugations of the strip 7 will exceed the hoop stress in a similar uncorrugated strip (or in the cylinder 4) if the spacing between contact areas exceeds $(Dt)^{1/2}$ where D is the diameter of the coil and $t$ is the thickness of the strip 7. Thus for a strip 7, 1 mm. thick, in a cylinder 4, 200 cm. internal diameter, the bending stress in the strip 7 will exceed the hoop stress when the distance between the contact areas exceeds about 4½ cm. In practice therefore a distance of 2–3 cm. would be chosen.

The cross section of the strip 7 is not necessarily the same for all turns, but may be varied to improve the mechanical strength. Thus at the centre of a coil the magnetic field is substantially axial and the force on the strip 7 is radial, whereas towards the ends of a coil the magnetic field tends to become radial and the force on the strip 7 becomes more axial. To withstand these forces better, therefore, both the cross section of the strip 7 and the area of the contacts to the copper may be varied over the length of the coil to improve the mechanical strength.

The invention is not limited in its application to any particular superconductor, and amongst the many superconductors which may be used are alloys of niobium/zirconium, niobium/titanium and niobium/tin. Also, other normal conductors may be used in place of copper, for example, aluminium.

I claim:

1. A composite electrical conductor comprising a length of superconductor and a normal conductor of high electrical conductivity which parallels the superconductor, the superconductor and the normal conductor being mechanically and electrically connected at spaced intervals along their length and disposed to avoid or reduce the effect upon the superconductor of stresses in the normal conductor.

2. A cylindrical coil comprising normal high conductivity material disposed outside a superconducting material which is mechanically and electrically connected to the normal high conductivity material as circumferentially spaced intervals, the superconducting material and the normal conductivity material being spaced apart between the connections, each interval being less than that at which the bending stress in the superconducting material equals the hoop stress in the rigid conductor under the action of a magnetic field due to current in the coil.

3. A coil as claimed in claim 2 wherein the superconducting material is in the form of a plurality of discrete rings located within the normal conductivity material.

4. A coil as claimed in claim 3 wherein the superconducting material is in the form of a helix located within the normal conductivity material.

5. A conductor as claimed in claim 1 wherein the shape of said superconductor is generally sinusoidal and said superconductor makes periodic contact with said normal conductor.

References Cited

UNITED STATES PATENTS 3,349,169 10/1967 Donadieu ------- 335—216 XR

DARRELL L. CLAY, *Primary Examiner.*

T. J. KOZMA, *Assistant Examiner.*

U.S. Cl. X.R.

174—126; 335—216; 336—225